United States Patent
Nishio et al.

(10) Patent No.: US 6,461,444 B1
(45) Date of Patent: Oct. 8, 2002

(54) METHOD AND APPARATUS FOR MANUFACTURING SEMICONDUCTOR DEVICE

(75) Inventors: Hitoshi Nishio, Shiga; Hideo Yamagishi, Kyoto; Masataka Kondo, Kobe, all of (JP)

(73) Assignee: Kaneka Corporation, Osaka (JP)

(*) Notice: Subject to any disclaimer, the term of this patent is extended or adjusted under 35 U.S.C. 154(b) by 0 days.

(21) Appl. No.: 09/531,933

(22) Filed: Mar. 21, 2000

(30) Foreign Application Priority Data

| Aug. 20, 1999 | (JP) | 11-234009 |
| Aug. 20, 1999 | (JP) | 11-234010 |
| Oct. 6, 1999 | (JP) | 11-285334 |
| Oct. 15, 1999 | (JP) | 11-293975 |

(51) Int. Cl.[7] .............. B08B 3/04; B08B 3/08
(52) U.S. Cl. .............. 134/29; 134/2; 134/26; 134/902
(58) Field of Search ............ 134/2, 26, 29, 134/902; 438/905

(56) References Cited

U.S. PATENT DOCUMENTS

| 4,748,130 A | * | 5/1988 | Wenham et al. ............ 438/675 |
| 5,258,077 A | * | 11/1993 | Shahryar ................... 136/256 |
| 5,616,208 A | * | 4/1997 | Lee .......................... 156/345 |
| 5,756,400 A | * | 5/1998 | Ye et al. .................. 438/905 X |
| 5,785,796 A | * | 7/1998 | Lee .......................... 156/345 |
| 5,817,534 A | * | 10/1998 | Ye et al. .................. 438/905 X |
| 6,156,968 A | * | 12/2000 | Nishimoto et al. ......... 136/252 |
| 6,267,123 B1 | * | 7/2001 | Yoshikawa et al. ........... 134/62 |
| 6,340,640 B1 | * | 1/2002 | Nishimoto et al. ......... 438/753 |

FOREIGN PATENT DOCUMENTS

| JP | 60-043819 | 3/1985 |
| JP | 61-032416 | 2/1986 |
| JP | 06-177409 | 6/1994 |

* cited by examiner

*Primary Examiner*—Alexander Markoff
(74) *Attorney, Agent, or Firm*—Hogan & Hartson, LLP (57) ABSTRACT

Disclosed is a method of manufacturing a semiconductor device, in which a substrate is successively transferred through a first film-forming chamber for forming a semiconductor layer of a first conductivity type, a second film-forming chamber for forming an i-type semiconductor layer, and a third film-forming chamber for forming a semiconductor layer of a second conductivity type, thereby forming successively a semiconductor layer of a first conductivity type, an i-type semiconductor layer, and a semiconductor layer of a second conductivity type on the substrate. The method comprises the step of simultaneously transferring the substrates arranged within the first, second and third film-forming chambers and each having a semiconductor layer into adjacent chambers on the downstream side.

5 Claims, 5 Drawing Sheets

METHOD AND APPARATUS FOR MANUFACTURING SEMICONDUCTOR DEVICE

CROSS-REFERENCE TO RELATED APPLICATIONS

This application is based upon and claims the benefit of priority from the prior Japanese Patent Applications No. 11-234009, filed Aug. 20, 1999; No. 11-234010, filed Aug. 20, 1999; No. 11-285334, filed Oct. 6, 1999; and No. 11-293975, filed Oct. 15, 1999, the entire contents of which are incorporated herein by reference.

BACKGROUND OF THE INVENTION

The present invention relates to a method of manufacturing a semiconductor device comprising the steps of forming a p-type semiconductor layer, an i-type semiconductor layer and an n-type semiconductor layer and to a film-forming apparatus.

In forming a solar battery panel, which is a semiconductor device, a p-type semiconductor layer, an i-type semiconductor layer and an n-type semiconductor are successively formed one upon the other on the surface of, for example, a glass substrate. These p-type semiconductor layer, i-type semiconductor layer and n-type semiconductor layer are formed to differ from each other in thickness. In general, the p-type semiconductor layer is formed thin to increase the amount of the effective light. Also, the i-type semiconductor layer is formed thick to improve the conversion efficiency. For example, the p-type semiconductor layer is formed in a thickness of about 70 Å, the i-type semiconductor layer is formed in a thickness of about 3000 Å, and the n-type semiconductor layer is formed in a thickness of about 150 Å in many cases.

Each of the p-type semiconductor layer, the i-type semiconductor layer and the n-type semiconductor layer is formed by a CVD method. The film formation by the CVD method is carried out within a film-forming chamber. In this case, it is known to the art that a p-type semiconductor layer, an i-type semiconductor layer and an n-type semiconductor layer are successively formed in a single film-forming chamber. In this method, however, the process time is rendered long, leading to a low productivity.

To overcome this difficulty, exclusive film-forming chambers are used for forming successively the p-type semiconductor layer, the i-type semiconductor layer, and the n-type semiconductor layer. It should be noted in this connection that the time required for forming the i-type semiconductor layer, which has the largest thickness, is considerably longer than the time required for forming any of the p-type and n-type semiconductor layers. It is unavoidable for the film-forming chambers for forming the p-type and n-type semiconductor layers to incur a loss time, leading to a low productivity.

On the other hand, the p-type, i-type and n-type semiconductor layers are formed in general at different temperatures. For example, the p-type semiconductor layer acting as a window layer on the side of the incident light is formed at a temperature lower than that for forming the i-type semiconductor layer in order to widen the band gap and to suppress the damage done to the electrode arranged below the p-type semiconductor layer. Also, the i-type semiconductor layer is formed at a temperature higher than that for forming the p-type semiconductor layer in view of the photostability.

Where the p-type, i-type and n-type semiconductor layers are formed in exclusive film-forming chambers arranged in series, each film-forming chamber is set at a temperature adapted for forming the desired semiconductor layer. For example, the film-forming chamber for forming the p-type semiconductor layer is set at about 160° C. Also, each of the chambers for forming the i-type and n-type semiconductor layers is set at about 200° C.

For improving the productivity in forming semiconductor layers on a substrate in this fashion, it is required to perform temperature control to permit the temperature of the substrate transferred into each of the film-forming chambers to be set at a film-forming temperature within the chamber in a short time. For example, if a p-type semiconductor layer has been formed on a substrate whose temperature has been controlled at 160° C., it is necessary to elevate the substrate temperature to about 200° C. for forming an i-type semiconductor layer on the p-type semiconductor layer in the next step.

However, even if the substrate is transferred into the film-forming chamber controlled at a predetermined temperature, it takes time for the substrate to be heated from 160° C. to a desired time of 200° C., with the result that the process time for forming a semiconductor layer on the substrate is rendered long. By contraries, even if the substrate temperature is set within a short process time, it is difficult to set the substrate temperature at a predetermined temperature within the short time. In addition, if the film-forming chambers are set at different temperatures conforming with the temperatures of the semiconductor layers formed within these chambers, the thermal stress received by the substrate transferred into the film-forming chamber of different temperature is increased. It follows that it is possible for bad effects to be given to the substrate and to the semiconductor layer formed on the substrate.

BRIEF SUMMARY OF THE INVENTION

An object of the present invention is to provide a method of manufacturing a semiconductor device, which permits successively forming a p-type semiconductor layer, an i-type semiconductor layer and an n-type semiconductor layer on a substrate surface in exclusive film-forming chambers while avoiding a loss time in operation of each of the film-forming chambers.

Another object is to provide an apparatus for manufacturing a semiconductor device, which permits successively forming a p-type semiconductor layer, an i-type semiconductor layer and an n-type semiconductor layer on a substrate surface in exclusive film-forming chambers while avoiding a loss time in operation of each of the film-forming chambers.

Another object is to provide a method of manufacturing a semiconductor device, which permits successively forming a p-type semiconductor layer, an i-type semiconductor layer and an n-type semiconductor layer on a substrate surface in a short time in exclusive film-forming chambers while suppressing a thermal stress given to the substrate and to the semiconductor layers formed on the substrate surface.

Still another object of the present invention is to provide an apparatus for manufacturing a semiconductor device, which permits successively forming a p-type semiconductor layer, an i-type semiconductor layer and an n-type semiconductor layer on a substrate surface in a short time in exclusive film-forming chambers while suppressing a thermal stress given to the substrate and to the semiconductor layers formed on the substrate surface.

According to a first aspect of the present invention, there is provided a method of manufacturing a semiconductor device, in which a substrate is successively transferred into a first film-forming chamber forming a semiconductor layer of a first conductivity type, a plurality of second film-forming chambers for forming an i-type semiconductor layer and a third film-forming chamber for forming a semiconductor layer of a second conductivity type, the first, second and third film-forming chambers being arranged in series, for successively forming a semiconductor layer of the first conductivity type, an i-type semiconductor layer and a semiconductor layer of the second conductivity type within these first, second and third film-forming chambers, respectively, on the surface of the substrate, the method comprising the step of simultaneously transferring the substrates arranged within the first, second and third film-forming chambers and each having a semiconductor layer formed thereon into adjacent chambers on the downstream side.

According to a second aspect of the present invention, there is provided an apparatus for manufacturing a semiconductor device, comprising a film-forming chamber body including a first film-forming chamber for forming a semiconductor layer of a first conductivity type, a second film-forming chamber for forming an i-type semiconductor layer, and a third film-forming chamber for forming a semiconductor layer of a second conductivity type, which are arranged in series; openable means for opening-closing communication holes formed in partition walls, each partition wall being for partitioning two adjacent film-forming chambers; control means for simultaneously driving all of the openable means so as to control opening-closing of the communication hole made in each of the partition walls; and transfer means for simultaneously transferring in the downstream direction the substrates having a semiconductor layer of the first conductivity type, an i-type semiconductor layer and a semiconductor layer of the second conductivity type formed thereon in the first, second and third film-forming chambers, respectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention is featured in that a first film-forming chamber for forming a semiconductor layer of a first conductivity type, a plurality of second film-forming chambers each for forming an i-type semiconductor layer, and a third film-forming chamber for forming a semiconductor layer of a second conductivity type are arranged in series, and that the substrates having the semiconductor layers formed thereon in the first, second and third film-forming chambers, respectively, are transferred simultaneously into the adjacent film-forming chambers on the downstream side.

In the present invention, a plurality of second film-forming chambers are arranged because it takes a longer time to form an i-type semiconductor layer in the second film-forming chamber. Because of the arrangement of a plurality of second film-forming chambers, the substrates having semiconductor layers formed thereon in the first, second and third film-forming chambers, respectively, can be simultaneously transferred into the adjacent film-forming chambers on the downstream side so as to eliminate the waiting time of operation and, thus, to improve the productivity.

In the present invention, the pressure in each of the first and third film-forming chambers for forming the p-type and n-type semiconductor layers can be made lower than that in the second film-forming chamber for forming the i-type semiconductor layer. Since the pressure in the second film-forming chamber for forming the i-type semiconductor layer is set higher, the impurities used for forming the p-type and n-type semiconductor layers are prevented from entering the second film-forming chamber when the substrates are simultaneously transferred into the adjacent film-forming chambers on the downstream side.

Also, in the present invention, the temperature within the first film-forming chamber can be set substantially equal to that within the second film-forming temperature. In this case, the substrate temperature in the step of forming the semiconductor layer of the first conductivity type within the first film-forming chamber can be set lower than that in the step of forming the i-type semiconductor layer within the second film-forming chamber because of the time lag for temperature elevation by heating.

In this case, the substrate temperature is gradually elevated from the temperature for forming the p-type semiconductor layer to the temperature for forming the i-type semiconductor layer, even if the temperature of a plurality of film-forming chambers is set substantially the same. As a result, the i-type semiconductor layer can be formed at a temperature higher than that for forming the p-type semiconductor layer. In addition, since the substrate temperature is gradually elevated during formation of the p-type semiconductor layer, the time required for heating the substrate to the temperature adapted for formation of the i-type semiconductor layer can be shortened.

In this case, the temperature of the film-forming chambers for forming the p-type semiconductor layer and the i-type semiconductor layer is set at 170 to 230° C. so as to form the p-type semiconductor layer at 150 to 190° C. because of the time lag noted above. Also, the thickness of the p-type semiconductor layer can be set at 50 to 200 Å. Further, it is possible not to heat the film-forming chamber for forming the n-type semiconductor layer. Further, the temperature control can be performed by a holder holding the substrate and transferred successively through a plurality of film-forming chambers communicating with each other, said holder being formed of a material having a predetermined heat capacity.

Figure 1:
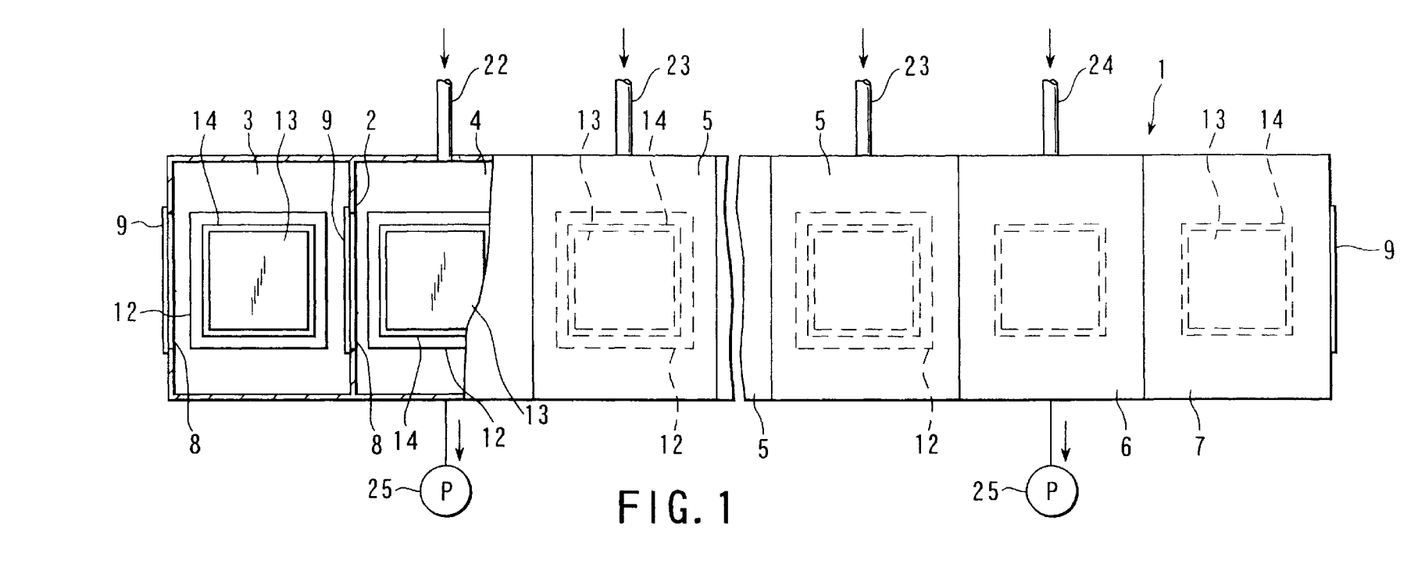
FIG. 1 is a front view showing the entire construction of an apparatus for manufacturing a semiconductor device according to a first embodiment of the present invention.
Figure 2:
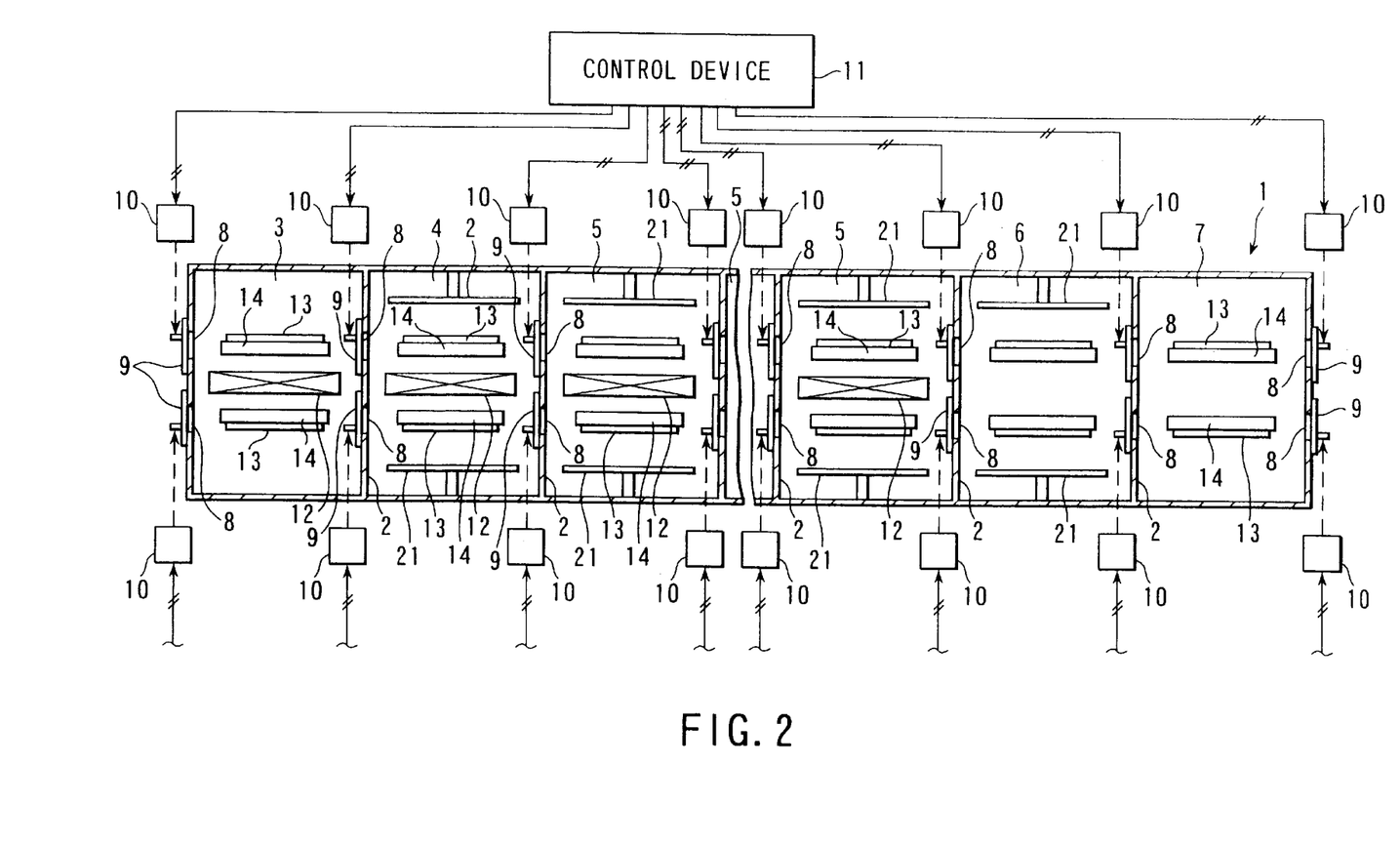
FIG. 2 is a lateral cross sectional view showing the entire construction of an apparatus for manufacturing a semiconductor device according to the first embodiment of the present invention.

Various embodiments of the present invention will now be described with reference to the accompanying drawings. Specifically, FIG. 1 is a partial vertical cross sectional view showing the entire construction of an apparatus for manufacturing a semiconductor device according to a first embodiment of the present invention, and FIG. 2 is a lateral cross sectional view of the apparatus shown in FIG. 1. As shown in the drawings, the manufacturing apparatus comprises an apparatus body 1 that is in the form of an oblong box. The inner space of the apparatus body 1 is partitioned into a plurality of chambers by partition walls 2.

To be more specific, the apparatus body 1 is partitioned by the partition walls 2 into a heating chamber 3, a first film-forming chamber 4, a plurality of second film-forming chambers 5, a third film-forming chamber 6 and a take-out chamber 7 in the order mentioned as viewed from one end portion in the longitudinal direction of the apparatus body 1. About 2 to 6 second film-forming chambers 5 are arranged in the present invention, though five second film-forming chambers 5 are arranged in this embodiment. Incidentally, three second film-forming chambers are omitted in FIGS. 1 and 2.

As shown in FIG. 2, a pair of rectangular communication holes 8 of the same size and shape are formed in each of the partition walls 2 partitioning the inner space of the apparatus body 1 into the chambers 3 to 7 and the two side walls in the longitudinal direction of the apparatus body 1. Each communication hole 8 is hermetically closed by an openable shutter 9. Each shutter 9 is driven by a driving source 10 to open or close the communication hole 8, and the driving of the driving source 10 is controlled by a control device 11. A linear motor or air cylinder can be used as the driving source 10.

In this embodiment, a driving signal is supplied from the control device 11 to the driving sources 10 at the same timing to permit the shutters 9 to close the communication holes 8 simultaneously.

A heater 12 is arranged in an upright posture in the central portion in the width direction of each of the chambers 3 to 5, though the heater 12 is not arranged within each of the third film-forming chamber 7 and the take-out chamber 7. These heaters 12 serve to heat the heating chamber 3, the first film-forming chamber 4 and the second film-forming chambers 5 upon receipt of a control signal supplied from the control device 11.

A pair of holders 14 each holding a substrate 13 on one surface are transferred through the communication holes 8 of the heating chamber 3 such that the other surface, on which the substrate 13 is not disposed, of each of the holders is positioned to face the heater 12. The holder 14 is made of a material having a predetermined heat capacity, e.g., a metal.

Like the heater 12, the holder 14 is also arranged in an upright posture and is successively transferred from the heating chamber 3 toward the take-out chamber 7 by, for example, a transfer robot (not shown) arranged within each of the chambers 3 to 7 as a transfer means. Incidentally, it is possible to arrange a conveyor as a transfer means in place of the robot within each of the chambers 3 to 7 for allowing the conveyor to transfer the holder 14 toward the chambers on the downstream side in the transfer direction.

The transfer of the holder 14 into the heating chamber 3, the transfer of the holder 14 out of the take-out chamber 7, and the transfer of the holder 14 into the adjacent chambers 4 to 7 on the downstream side are carried out in synchronism with the timing at which the communication holes 9 closed by the shutters 9 are opened. In other words, the substrates 13 having the treatments, which are to be described herein later, applied thereto in the chambers 4 to 7 are successively transferred together with the holders 14 into the chambers arranged on the downstream side at the same timing.

Figure 3:
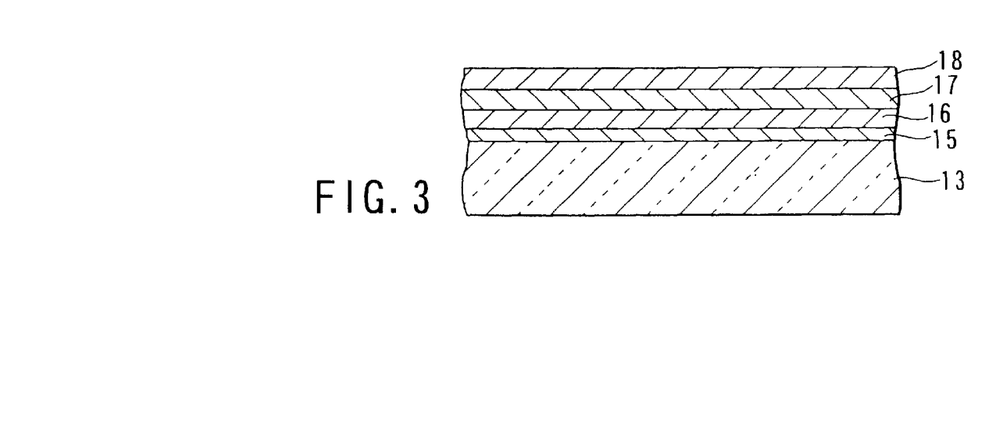
FIG. 3 is a cross sectional view showing a semiconductor film formed by the semiconductor manufacturing apparatus shown in FIG. 1.

The substrate 13 is a glass panel used for forming, for example, a solar battery panel. As shown in FIG. 3, a transparent electrode film 15 is formed in advance on one surface of the substrate 13. As described herein later, a p-type semiconductor layer 16, an i-type semiconductor layer 17 and an n-type semiconductor layer 18 each consisting of an amorphous silicon layer, are formed successively on the transparent electrode layer 15.

The transparent electrode layer 15 consists of $SnO_2$. Where the transparent electrode layer 15 is formed at a high temperature in the case of using $SnO_2$, $SnO_2$ is unlikely to be reduced even if $SnO_2$ is brought into contact with a reducing plasma containing hydrogen atoms. Also, the amount of metal formed is diminished. It follows that the semiconductor layers are prevented from being contaminated and, thus, it is possible to suppress markedly the deterioration of the characteristics.

In each of the first to third film-forming chambers 4 to 6, a pair of high frequency electrodes 21 are arranged to face the substrate 13 held by the holder 14. A high frequency power is supplied from the control device 11 to each of the high frequency electrodes 21.

As shown in FIG. 1, a first supply pipe 22 is connected to the first film-forming chamber 4. A first raw material gas used for forming the p-type semiconductor layer 16 is supplied through the first supply pipe 22 into the first film-forming chamber 4. Likewise, a second supply pipe 23 for supplying a raw material gas used for forming the i-type semiconductor layer 17 is connected to each of the second film-forming chambers 5. Further, a third supply pipe 24 for supplying a raw material gas used for forming the n-type semiconductor layer 18 is connected to the third film-forming chamber 6.

Used as the raw material gas is, for example, $SiH_4$. The raw material gas supplied to the first film-forming chamber 4 is mixed with, for example, $BH_3$ used as an impurity, and the raw material gas supplied to the third film-forming chamber 6 is mixed with, for example, $PH_3$ as an impurity. In some cases, the raw material gas is supplied through a plurality of supply pipes into each of the film-forming chambers.

Further, a vacuum pump 25 is connected to each of the first film-forming chamber 4 and the third film-forming chamber 6 so as to reduce the inner pressure of each of these first and third film-forming chambers 4 and 6. Incidentally, each of the second film-forming chambers 5 is used under an atmospheric pressure, making it unnecessary to connect a vacuum pump to these second film-forming chambers 5.

The inner pressure within each of the first film-forming chamber 4 and the third film-forming chamber 6 is reduced to a predetermined level, followed by supplying the raw material gases into these first film-forming chamber 4, second film-forming chamber 5 and third film-forming chamber 6. If a high frequency power is supplied under this condition to the high frequency electrodes 21, the raw material gas supplied into each of the film-forming chambers 4 to 6 is excited to form a plasma. As a result, the p-type semiconductor layer 16, the i-type semiconductor layer 17 and the n-type semiconductor layer 18 are formed on the substrate 13 in these film-forming chambers 4, 5 and 6, respectively.

The manufacturing apparatus of a semiconductor device constructed as described above is used as follows for forming semiconductor layers (amorphous silicon layers) on the substrate 13.

In the first step, the heaters 12 arranged within the heating chamber 3, the first film-forming chamber 4 and the second film-forming chambers 5 are turned on so as to heat these chambers 3, 4 and 5 to the same temperature. To be more specific, for forming the semiconductor layers on the substrate 13, the i-type semiconductor layer 17 is required to be formed at a temperature higher than that for forming the p-type semiconductor layer 16 in order to improve the performance. Therefore, the temperature within the film-forming chambers 3, 4, 5 is set at 170° C. to 230° C., preferably about 200° C., which is adapted for formation of the i-type semiconductor layer 17.

After the inner pressure of the first and third film-forming chambers 4 and 6 is reduced to a predetermined level, a raw material gas used for forming semiconductor layers is supplied into each of these film-forming chambers 4 and 6. On the other hand, the raw material gas is introduced into each of the second film-forming chambers 5 without reducing the inner pressure thereof.

After introduction of the raw material gases into the film-forming chambers, the operation of the apparatus is started by operating the control device 11 so as to drive the shutters 9 to permit the communication holes 8 within each of the chambers 3 to 7 to be opened. At the same time, the holder 14 holding the substrate 13 is introduced into the heating chamber 3. If the holder 14 is present in this stage in each of the first to third film-forming chambers 4 to 6 and the take-out chamber 7, the holders 14 are successively transferred into the adjacent chambers on the downstream side. Also, the holder 14 in the take-out chamber 7 is taken out of the take-out chamber 7. The following description covers the case where a single holder 14 is successively transferred into the chambers on the downstream side.

The holder 14 is intermittently transferred every predetermined time. To be more specific, a predetermined time after introduction of the holder 14 into the heating chamber 3, the holder 14 is transferred into the succeeding first film-forming chamber 4. In this stage, a high frequency power is supplied to the high frequency electrodes 21 within the first film-forming chamber 4 so as to excite the raw material within the first film-forming chamber 4 and, thus, to generate a plasma. As a result, a p-type semiconductor layer 16 is formed on the substrate 13 held by the holder 14 transferred into the first film-forming chamber 4.

A predetermined period of time later, the holder 14 within the first film-forming chamber 4 is transferred into one of a plurality of second film-forming chambers 5, i.e., the second film-forming chamber 5 on the upstream side. Within the particular second film-forming chamber 5, an i-type semiconductor layer 17 is formed on the p-type semiconductor layer 16 that was formed first on the substrate 13. Formation of the i-type semiconductor layer is repeatedly performed within the plural second film-forming chambers 5. As a result, the final i-type semiconductor layer 17 is rendered sufficiently thicker than the p-type semiconductor layer 16.

After formation of the i-type semiconductor layer 17 in a predetermined thickness within the plural second film-forming chambers 5, the holder 14 holding the substrate 13 is transferred into the third film-forming chamber 6. Within the third film-forming chamber 6, an n-type semiconductor layer 18 is formed on the i-type semiconductor layer 17 on the substrate 13. Further, after formation of the n-type semiconductor layer 18, the holder 14 holding the substrate 13 is taken out to the outside through the take-out chamber 7 so as to be further transferred to the subsequent process.

It should be noted that, if the first holder 14 is transferred from the heating chamber 3 into the first film-forming chamber 4, the succeeding holder 14 is transferred into the heating chamber 3. It follows that the required treatments are performed simultaneously within all of the chambers 3 to 7. Also, the holders 14 are simultaneously transferred from all the chambers 3 to 7 into the adjacent chambers on the downstream side. FIGS. 1 and 2 show that the holder 14 is positioned within each of the chambers 3 to 7.

Figure 4:
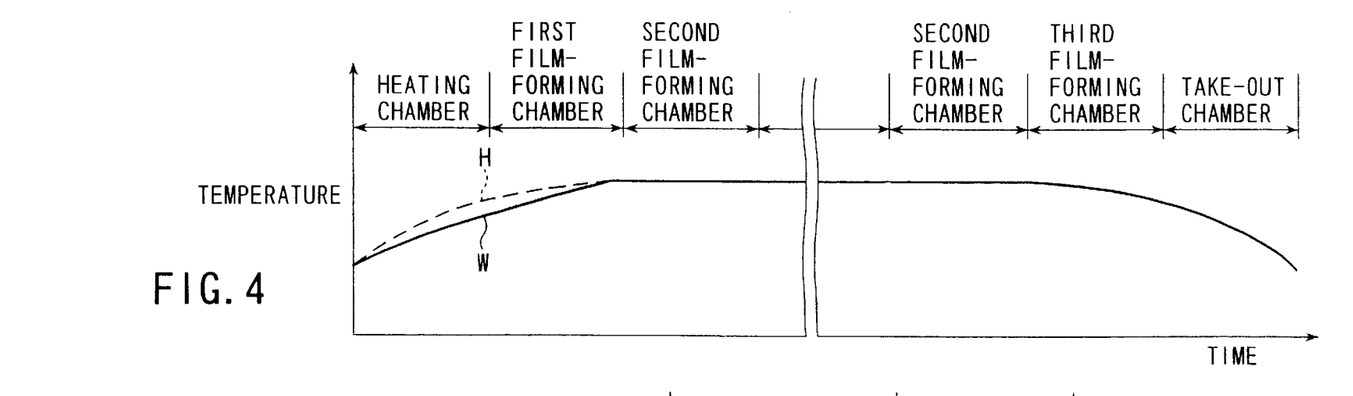
FIG. 4 is a graph showing the changes with time in the temperatures of the substrate and the holder according to the first embodiment of the present invention.

FIG. 4 is a graph showing the changes with time in the temperatures of the substrate 13 and the holder 14 covering the process starting with introduction of the holder 14 holding the substrate 13 into the heating chamber 3 and ending with the discharge of the holder 14 out of the take-out chamber 7. A solid curve W shown in the graph represents the change in the temperature of the substrate 13. Also, another curve H denoted by a broken line represents the change in the temperature of the holder 14.

As described previously, the heater 12 within the heating chamber 3 is arranged to face that surface of the holder 14 on which the substrate 13 is not supported. Naturally, the temperature elevation rate of the holder 14 is higher than that of the substrate 13 when the holder 14 holding the substrate 13 is introduced into the heating chamber 3, apparent from the graph of FIG. 4. On the other hand, the residence time of the holder 14 within the heating chamber 3 is set at a predetermined value, i.e., time that is not long enough for the holder 14 to be heated to about 200° C. that is the set temperature of the heating chamber 3. As a result, the holder 14 and the substrate 13 are transferred into the first film-forming chamber 4 at, for example, 140° C. to 150° C., which is lower than 200° C. set for the heating chamber 3.

The temperature of the first film-forming chamber 4 is set at 200° C. Therefore, if the holder 14 and the substrate 13 are transferred into the first film-forming chamber 4, the temperatures of the holder 14 and the substrate 13 are gradually increased within the first film-forming chamber 4, compared with the temperatures at which the holder 14 and the substrate 13 are transferred out of the heating chamber 3. During the process of the temperature elevation, the p-type semiconductor layer 16 is formed on the surface of the substrate 13 within the first film-forming chamber 4.

In this embodiment, the p-type semiconductor layer 16 is formed under the state that the substrate 13 is heated to about 160° C. The temperature of the substrate 13 within the first film-forming chamber 4 is determined by the period of time between introduction of the substrate 13 into the heating chamber 3 and the p-type semiconductor layer formation within the first film-forming chamber 4 and by the heat capacity of the holder 14, i.e., by the material and thickness of the holder 14. Therefore, even if the temperature within the heating chamber 3 and the first film-forming chamber 4 is set at 200° C., the heat capacity of the holder 14 makes it possible for the substrate 13 to be introduced into the first film-forming chamber 4 at about 160° C. that is sufficiently lower than 200° C. As a result, the p-type semiconductor layer 16 can be formed at about 160° C. that is sufficiently lower than the temperature set in the first film-forming chamber 4.

The p-type semiconductor layer 16 is formed in general in a thickness of 50 to 200 Å. In this embodiment, the p-type semiconductor layer 16 is formed in a thickness of about 70 Å. If the p-type semiconductor layer 16 is formed sufficiently thin, the amount of the effective light can be increased. Incidentally, the thickness of the p-type semiconductor layer 16 can be controlled by controlling the film-forming time.

Until the substrate 13 is transferred from the first film-forming chamber 4 into the adjacent second film-forming chamber 5, the holder 14 is sufficiently heated to reach the temperature of 200° C. set in the second film-forming chamber 5. Naturally, the substrate 13 held by the holder 14 is also heated to 200° C. that is substantially equal to the temperature set in the second film-forming chamber 5.

An i-type semiconductor layer 17 is successively formed on the substrate 13 within the plural second film-forming chambers 5. In this embodiment, five second-film forming chambers 5 are included in the semiconductor device manufacturing apparatus. Since the i-type semiconductor layer 17 is formed in the five second film-forming chambers 5, the thickness of the i-type semiconductor layer 17 can be made markedly larger than that of the p-type semiconductor layer 16 such that the thickness of the i-type semiconductor layer 17 reaches, for example, about 700 Å.

The substrate 13 having the i-type semiconductor layer 17 formed thereon is then transferred into the third film-forming chamber 6 to form an n-type semiconductor layer 8 on the i-type semiconductor layer 17. A heater is not arranged within the third film-forming chamber 6. Therefore, the substrate 13 heated to 200° C. within the second film-forming chambers 5 is gradually cooled during formation of the n-type semiconductor layer 18.

It should be noted that the holder 14 produces a heat accumulating effect, with the result that the substrate 13 is prevented from being cooled rapidly. It should also be noted that the n-type semiconductor layer 18 is formed in a thickness of about 150 Å.

The substrate 13 having the n-type semiconductor layer 18 formed thereon in the third film-forming chamber 6 is transferred into the take-out chamber 7 and allowed to stand within the take-out chamber 7 until the substrate 13 is cooled to temperatures at which the substrate 13 can be handled.

During formation of the n-type semiconductor layer 18 within the third film-forming chamber 6, the substrate 13 is not heated by a heater. Naturally, the substrate 13 transferred into the third film-forming chamber 6 is gradually cooled. Also, the substrate 13 having the n-type semiconductor layer 18 formed thereon is held within the take-out chamber 6 for a predetermined period of time. As a result, the substrate 13, when withdrawn from within the take-out chamber 7, is cooled to a temperature at which the substrate 13 can be handled sufficiently. In other words, the substrate 13 withdrawn from within the take-out chamber 7 can be handled immediately.

Where the holders 14 within the chambers 3 to 7 are transferred to adjacent chambers on the downstream side or to the outside from the take-out chamber 7, all the shutters 9 are simultaneously driven by the driving sources 10 so as to open the communication holes 8 of the chambers 3 to 7. Then, the holders 14 within the chambers 3 to 7 are simultaneously transferred through the communication holes 8 to the adjacent chambers on the downstream side or to the outside by a transfer means such as robots (not shown).

Since five second film-forming chambers 5 are arranged for forming the i-type semiconductor layer 17, the i-type semiconductor layer 17 is repeatedly formed within these five second film-forming chambers 5. Therefore, the i-type semiconductor layer 17 can be formed thicker than any of the p-type semiconductor layer 16 and the n-type semiconductor layer 18 even if all the holders 14 within the chambers 3 to 7 are simultaneously moved in the downstream direction. In addition, the p-type, i-type and n-type semiconductor layers are formed in desired thicknesses on the substrate 13 held by the holder 14 within the film-forming chambers 4, 5 and 6 because a plurality of second film-forming chambers 5 are arranged in the present invention.

What should be noted is that, even where the i-type semiconductor layer 17 is formed thicker than any of the p-type semiconductor layer 16 and the n-type semiconductor layer 18, these semiconductor layers can be formed continuously within the film-forming chambers 4, 5 and 6 without giving rise to a waiting time of operation. As a result, the process time starting with introduction of the substrate 13 into the first film-forming chamber 4 and ending with transfer of the substrate 13 from within the third film-forming chamber 6 can be shortened so as to increase the productivity.

The inner pressure of each of the first film-forming chamber 4 and the third film-forming chamber 6 is reduced by the vacuum pump 25 to make the inner pressure noted above lower than that of the second film-forming chamber 5. As a result, even if the second film-forming chambers are allowed to communicate with the first film-forming chamber 4 and with the third film-forming chamber 6 in simultaneously transferring the holders 14 within the chambers 3 to 7, the raw material gases containing impurities that are supplied to the first film-forming chamber 4 and the third film-forming chamber 6 are prevented from flowing into the second film-forming chambers 5 having a higher inner pressure. It follows that it is possible to prevent without fail the impurities from being mixed in the i-type semiconductor layer 17 formed in the second film-forming chamber 5.

The present invention is not limited to the embodiment described above and can be modified in various fashions. For example, in the embodiment described above, a take-out chamber 7 is arranged downstream of the third film-forming chamber 6. However, it is not absolutely necessary to arrange such a take-out chamber. Also, it is possible to arrange a heater within the third film-forming chamber 6 to control the temperature within the third film-forming chamber at a level equal to that within the first and second film-forming chambers. In this case, the temperature of the third film-forming chamber 6 can be set at 200° C., which is equal to that of the first and second film-forming chambers 4 and 5, or at a level slightly lower than 200° C.

Also, in the embodiment described above, a p-type semiconductor layer, an i-type semiconductor layer and an n-type semiconductor layer are formed in the order mentioned on a transparent substrate. However, it is possible to form an n-type semiconductor layer, an i-type semiconductor layer and a p-type semiconductor layer in the order mentioned. Further, the semiconductor layers may be of a tandem structure having a plurality of laminate structures each consisting of a p-type semiconductor layer, an i-type semiconductor layer and an n-type semiconductor layer.

Also, the number of second film-forming chambers for forming an i-type semiconductor layer is not limited to 2 to 6. In other words, it is possible to use 7 or more second film-forming chambers. What is important is that the number of second film-forming chambers is determined to permit the i-type semiconductor layer taken out of the final second film-forming chamber to have a desired thickness in the case of simultaneously transferring the holders within all the chambers.

In the embodiment described above, the semiconductor device manufacturing apparatus comprises a single first film-forming chamber and a single third film-forming chamber. However, it is of course possible to use a plurality of first film-forming chambers and a plurality of third film-forming chambers depending on the desired thickness of the p-type semiconductor layer and the n-type semiconductor layer.

Figure 5:
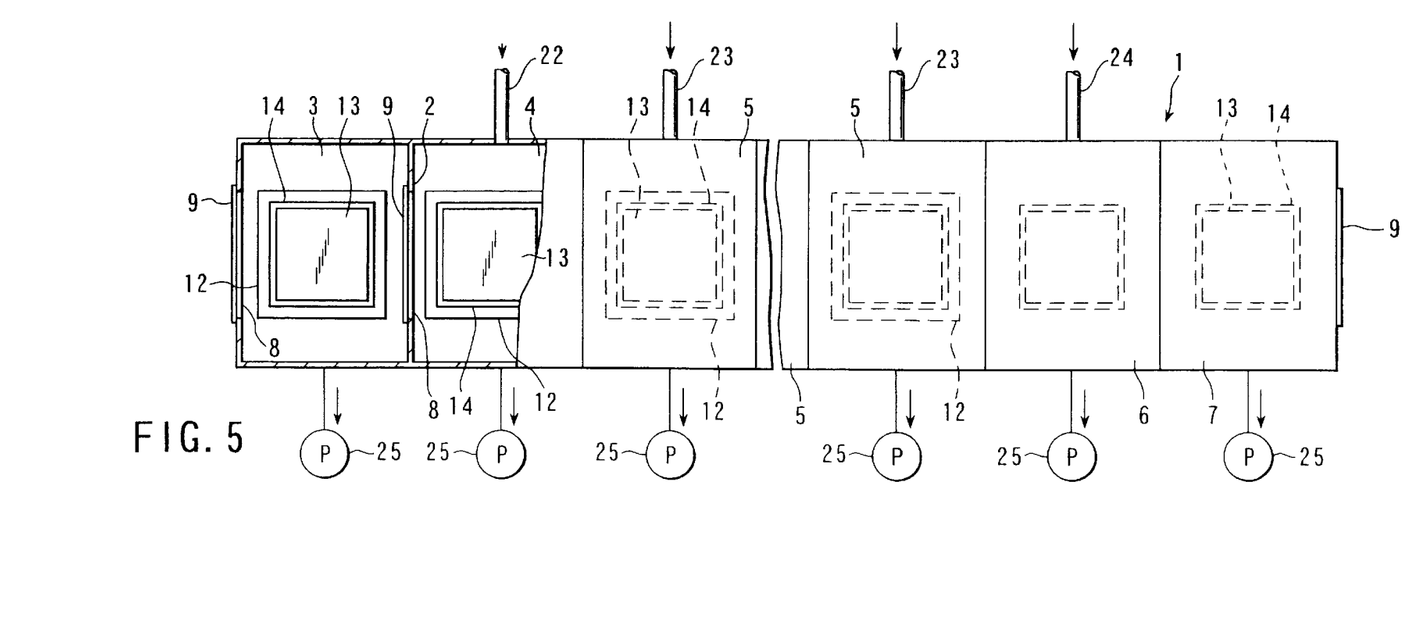
FIG. 5 is a front view showing a modification of the apparatus for manufacturing a semiconductor device according to the first embodiment of the present invention.

In the embodiment described above, the vacuum pump 25 is connected to only the first film-forming chamber 4 and the third film-forming chamber 6, as shown in FIG. 1. Alternatively, the vacuum pump 25 can be connected to each of the chambers, as shown in FIG. 5 so as to reduce the inner pressure of each of the chambers.

As described above, a plurality of second film-forming chambers are arranged in the present invention for forming an i-type semiconductor layer in a large thickness, and all the substrates held within the heating chamber, film-forming chambers and take-out chamber are simultaneously transferred to adjacent chambers on the downstream side. As a result, a waiting time of operation can be eliminated so as to improve the productivity.

It should also be noted that the pressure within the film-forming chamber for forming each of the p-type semiconductor layer and the n-type semiconductor layer is set lower than that within the second film-forming chamber for forming the i-type semiconductor layer in the present invention. It follows that, even if the substrates held in all the chambers are simultaneously transferred to adjacent chambers on the downstream side for improving the productivity, it is possible to prevent the impurities used for forming the p-type and n-type semiconductor layers from entering the chamber for forming the i-type semiconductor layer.

Further, in this embodiment, the first film-forming chamber 4 and the second film-forming chambers 5 can be made substantially equal to each other in temperature, though the substrate temperature at which the i-type semiconductor layer is formed within the second film-forming temperature 5 is higher than that at which the p-type semiconductor layer is formed within the first film-forming chamber 4. What should be noted is that each of the p-type semiconductor layer and the i-type semiconductor layer is formed when the substrate temperature is elevated to the desired level in the step of forming the semiconductor layer because of the time lag of the temperature elevation. It follows that it is possible to eliminate the waiting time required for heating the substrate to the desired temperature so as to shorten the process time and, thus, to improve the productivity. In addition, since the first and second film-forming chambers are set at the same temperature, it is possible to alleviate the thermal stress applied to the substrate, thereby to diminish the particle generation.

As already described, the p-type semiconductor layer is formed at a temperature lower than that for forming the i-type semiconductor layer, making it possible to widen the band gap of the p-type semiconductor layer, to suppress the damage done to the lower electrode, and to improve the photostability of the i-type semiconductor layer.

Also, since the p-type semiconductor layer is formed in a predetermined thickness, the p-type semiconductor layer can be formed at a suitable temperature. Also, the amount of the effective light can be increased.

What should also be noted is that the third film-forming chamber for forming an n-type semiconductor layer is not heated, with the result that the time required for cooling the substrate after formation of the n-type semiconductor layer can be shortened, leading to an improved productivity.

A second embodiment of the present invention will now be described.

In an in-line separated multi-chamber type film-forming apparatus as shown in FIG. 1, the substrate is heated in general to about 200° C. by a heater arranged within the film-forming chamber for forming a semiconductor layer on the substrate. However, the heating under vacuum takes a long time, leading to a high manufacturing cost. Also, since the substrate is successively moved, it is very difficult to monitor the substrate temperature within the film-forming chamber.

In addition, heat is accumulated in the holder supporting the substrate during repeated use of the holder. Also, the substrate is affected by the ambient temperature. Such being the situation, the temperature of the substrate arranged within a loading chamber fails to be maintained constant, making it difficult to maintain constant the temperature of the substrate arranged within the film-former.

For overcoming the above-noted problem, the second embodiment of the present invention is directed to a method of manufacturing a photoelectric conversion device, comprising the step of successively transferring the holder supporting the substrate into a plurality of film-forming chambers arranged in an in-line configuration for forming a semiconductor layer on the surface of the substrate within each of the film-forming chambers, wherein the temperature of the substrate supported on the holder, which is introduced into the first film-forming chamber, is controlled constant under the atmospheric pressure.

In the second embodiment of the present invention, it is possible to monitor the temperature of the substrate that is introduced into the first film-forming chamber and the temperature of the substrate that is withdrawn from the final film-forming chamber. It is also possible to control the temperatures within a plurality of film-forming chambers in accordance with the monitored temperature of the substrate introduced into the first film-forming chamber. Incidentally, the substrate temperature can be monitored by mounting a thermometer to the holder.

The temperature of the substrate supported on the holder that is introduced into the first film-forming chamber can be controlled by blowing a hot air against the substrate, by spraying the substrate with a high pressure steam, or by irradiating the substrate with infrared rays. Among these methods, it is most desirable to employ the method of blowing a hot air against the substrate because the particular method is easy to carry out, low in cost, and permits the required temperature elevation in a short time. It is desirable to use a cleansed clean air as the hot air.

Since a semiconductor layer is formed within the first film-forming chamber at 160° C. to 240° C., it is desirable for the temperature of the substrate supported on the holder that is introduced into the first film-forming chamber to be lower than and close to the temperature range given above. To be more specific, it is desirable for the particular temperature to be controlled to exceed 100° C., e.g., at 100° C. to 150° C.

In the second embodiment of the present invention constructed as described above, the temperature of the substrate supported on the holder that is introduced into the first film-forming chamber is controlled constant under the atmospheric pressure, making it possible to control the substrate temperature within the film-forming chambers easily in a short time and at a low cost.

Figure 6:
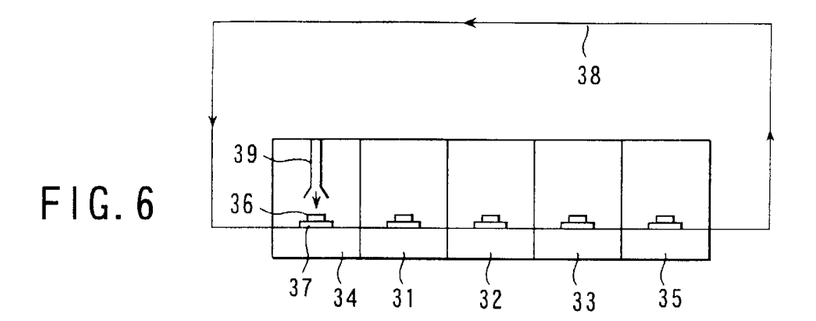
FIG. 6, which schematically shows an apparatus for manufacturing a semiconductor device, is for description of a second embodiment of the present invention.

FIG. 6 schematically shows an in-line CVD film-forming apparatus according to the second embodiment of the present invention. The apparatus shown in FIGS. 1 and 2 is actually employed in the second embodiment. Specifically, an i-type semiconductor layer is formed in a plurality of film-forming chambers, and a plurality of substrates are simultaneously transferred into the adjacent film-forming chambers on the downstream side. For the sake of brevity, however, the second embodiment will be described with reference to FIG. 6, covering the case where a single substrate is successively transferred through a plurality of film-forming chambers.

As shown in FIG. 6, a film-forming chamber 31 for forming a p-type semiconductor layer, a film-forming chamber 32 for forming an i-type semiconductor layer and a film-forming chamber 33 for forming an n-type semiconductor layer are arranged in series. Also, a loading chamber 34 is arranged upstream of the film-forming chamber 31, and an unloading chamber 35 is arranged downstream of the film-forming chamber 33.

A holder 37 holding a substrate 36 on which semiconductor layers are to be formed is transferred by a holder circulating system 38 through the loading chamber 34, the film-forming chambers 31, 32, 33 and the unloading chamber 35 so as to be used repeatedly, as apparent from the drawing.

In the loading chamber 34, a hot air is blown through a blowing nozzle 39 against the substrate 36 supported on the holder 37, with the result that the substrate 36 is heated to a predetermined temperature. In general, the substrate 36 is heated to 100° C. to 150° C. within the loading chamber 34. Naturally, the temperature and the blowing time of the hot air are controlled to permit the substrate 36 to be heated to a desired temperature. It is necessary to carry out the temperature control in view of the temperature of the holder itself and the ambient temperature. Further, the temperature of the holder withdrawn from the final film-forming chamber 33 is also taken into account in carrying out the temperature control.

Atmospheric pressure is maintained within the loading chamber 34. Therefore, the temperature of the substrate within the loading chamber 34 can be elevated by the blowing of the hot air to a desired level easily in a short time.

The substrate 36 heated to the desired temperature is successively transferred into the film-forming chamber 31, the film-forming chamber 32 and the film-forming chamber 33 for forming a p-type semiconductor layer, an i-type semiconductor layer and an n-type semiconductor layer, respectively, on the substrate 36. In each of the film-forming chambers, the semiconductor layer is formed on the substrate 36 heated to 200° C. by a heater. It should be noted in this connection that the substrate 36 is heated to a predetermined temperature falling within a range of between 100° C. and 150° C. before the substrate 36 is transferred into the film-forming chamber 31 for forming a p-type semiconductor layer. Therefore, the temperature elevation to 200° C. can be achieved accurately in a very short time.

As described previously, a thermometer is mounted to the holder 37, and the temperature of the holder 37 is monitored when the holder 37 is introduced into the first film-forming chamber 31 and when withdrawn from the final film-forming chamber 33. The temperature of the heater arranged within each of the film-forming chambers is controlled on the basis of the monitored temperature.

Incidentally, it is possible to arrange at least one intermediate chamber between adjacent film-forming chambers shown in FIG. 6, i.e., between the film-forming chamber 31 and the film-forming chamber 32 and/or between the film-forming chamber 32 and the film-forming chamber 33. It is also possible to use a plurality of film-forming chambers for forming the same kind of the semiconductor layer in view of the differences in the desired thickness and in the film-forming time among the semiconductor layers formed on the same substrate.

A p-type amorphous semiconductor layer, an i-type amorphous semiconductor layer and an n-type amorphous semiconductor layer were successively formed on a substrate having a $SnO_2$ glass layer formed thereon in advance by using a CVD film-forming apparatus in which a plurality of parallel plate capacitor coupling type glow discharge decomposition film-forming chambers were arranged in an in-line configuration.

In the first step, the substrate 36 having a $SnO_2$ glass layer formed thereon in advance was disposed on the holder 37 within the loading chamber 34. Then, the substrate temperature was elevated to 120° C. by blowing a hot air of 200° C. under the atmospheric pressure against the substrate 36 through the hot air nozzle 39 for 300 seconds. The substrate temperature was monitored by the thermometer mounted to the holder 37.

Then, the holder 37 supporting the substrate 36 was transferred into the film-forming chamber 31 for forming a p-type semiconductor layer, and the substrate 36 was heated within the film-forming chamber 31 by a heater set at 180° C. Under this condition, 300 sccm of $SiH_4$, 700 sccm of $CH_3$, 5 sccm of $B_2H_6$ and 1000 sccm of $H_2$ were introduced into the first film-forming chamber 31 so as to form a p-type amorphous semiconductor layer in a thickness of 10 nm under the reaction pressure of 1 Torr and an RF power of 30 $mW/cm^2$.

In the next step, the residual gas within the film-forming chamber 31 was exhausted, followed by transferring the holder 37 supporting the substrate 36 into the adjacent film-forming chamber 32 for forming an i-type semiconductor layer. The film-forming chamber 32 was heated under a reduced pressure with the heater temperature set at 200° C., followed by introducing 500 sccm of $SiH_4$ into the film-forming chamber 32 so as to form an i-type semiconductor layer in a thickness of 300 nm under a reaction pressure of 0.3 Torr and an RF power of 50 $mW/cm^2$.

Further, the residual gas within the film-forming chamber 32 was exhausted, followed by transferring the holder 37 supporting the substrate 36 into the adjacent film-forming chamber 33 for forming an n-type semiconductor layer. The film-forming chamber 33 was heated under a reduced pressure with the heater temperature set at 200° C., followed by introducing 200 sccm of $SiH_4$, 5 sccm of $PH_3$ and 4000 sccm of $H_2$ into the film-forming chamber 33 so as to form an n-type semiconductor layer in a thickness of 20 nm under a reaction pressure of 1 Torr and an RF power of 100 $mW/cm^2$.

In this fashion, an amorphous semiconductor film of a three-layer structure having a pin junction was formed on the glass substrate 36 having a $SnO_2$ layer formed thereon in advance.

After formation of the amorphous semiconductor film, the substrate 36 was detached from the holder within the unloading chamber 35 and transferred to the subsequent process. On the other hand, the holder 37 was further transferred from the unloading chamber 35 back into the loading chamber 34.

In the film-forming process described above, the substrate 36 is heated by a hot air to a predetermined temperature before the substrate 36 is introduced into the film-forming chamber 31 for forming the p-type semiconductor layer. The temperature is monitored by the thermometer mounted to the holder 37, and the temperature of the heater within the film-forming chamber 31 for forming the p-type semiconductor layer is set in accordance with the monitored temperature. Therefore, the substrate 36 within the film-forming chamber 31 is heated to the temperature required for forming the p-type semiconductor layer accurately in a short time. Naturally, the temperature of the substrate 36 within the film-forming chamber 31 can be controlled easily.

As described above, in the second embodiment of the present invention, the temperature of the substrate held by the holder, which is introduced into the first film-forming chamber, is controlled at a desired value under the atmospheric pressure. It follows that the temperature of the substrate within the film-forming chamber can be controlled easily in a short time and at a low cost.

A third embodiment of the present invention is directed to a method and apparatus for washing a silicon-based semiconductor film-forming apparatus such as a plasma CVD apparatus. Particularly, the third embodiment is directed to a method and apparatus for washing the inner members of a mass production type film-forming apparatus such as an in-line type plasma CVD apparatus and for washing the trays on which substrates are arranged.

Figure 7:
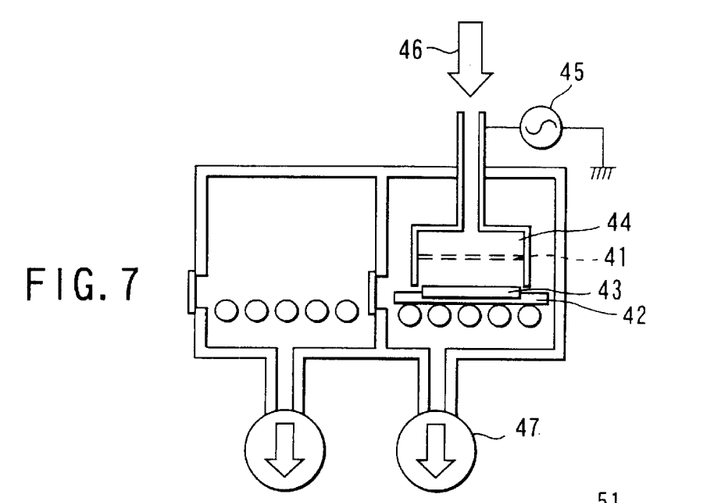
FIG. 7 exemplifies a plasma CVD apparatus.

In a silicon-based semiconductor film-forming apparatus such as a plasma CVD apparatus, a substrate 43 is disposed on a tray 42 and transferred into a film-forming chamber as shown in, for example, FIG. 7. Under this condition, a semiconductor gas such as a silane gas is introduced from a gas introducing system 46 into the reaction chamber through a shower plate 41. At the same time, a high frequency power generated from an RF power source 45 and having a frequency of, for example, 13.56 MHz is applied between a cathode 44 and an anode (tray) 42 so as to decompose the semiconductor gas and, thus, to form a silicon-based semiconductor thin film on the substrate surface. In this case, the semiconductor thin film is formed on the substrate 43. At the same time, it is possible for a semiconductor thin film to be formed on the tray 42 and on the shower plate 41. It is also possible for a silicon-containing powder to be formed by a local discharge.

The silicon-based film thus formed does not affect the semiconductor thin film formed on the substrate in the initial stage of the film formation. However, the silicon-based film in question grows thick if the film-forming process is repeated many times. Finally, the silicon-based film is peeled off the inner surface of the apparatus to form a dust that drops down during the semiconductor film formation. As a result, a defect such as a pin hole is generated. Such a phenomenon constitutes a problem that occurs not only in a plasma CVD apparatus but also in a sputtering apparatus or a thermal CVD apparatus.

For removing such a silicon-based film, it was customary in the past to remove the parts within the apparatus to which such a film is attached and the tray from the apparatus. The removed parts and the tray are moved to another site, and the undesired silicon-based film is removed by a treatment such as a glass beads blast method (method of blowing glass particles), a liquid honing method or washing with an acid. Finally, these parts and the tray are assembled again. It is also known to the art to remove the silicon-based film by the method of introducing an etching gas into the apparatus or into another site for generating a plasma.

In the conventional method of removing the silicon-based film described above, it is certainly possible to remove relatively easily the film that has grown thick. However, in the glass beads blast method and the tray, with the result that these parts tend to be deformed. Also, when it comes to the washing method using an acid, it is possible to remove the $SiO_2$ film and $SiN_x$ film. However, it is difficult to remove the a-Si film and poly-Si film. Particularly, when it comes to a large plasma CVD apparatus, the deformation of the tray makes it difficult to position the substrate accurately as desired. Also, the deformation causes the film formed on the substrate to fail to have a uniform thickness over the entire region. Under the circumstances, it was necessary to pay sufficient attentions to the deformation of the tray.

On the other hand, in the case of using an etching gas, it is necessary to use a highly corrosive gas such as $NF_3$ or $ClF_3$ for increasing the rate of removing the silicon-based film. It is theoretically necessary to use the etching in an amount equal to the amount of the reaction gas. Also, the price of the etching gas is equal to or higher than that of the semiconductor gas, leading to a high material cost. What should also be noted is that it is necessary to use a pump resistant to the corrosive gas or to the reaction product in the exhaust system of the film-forming apparatus, leading to a high apparatus cost.

Further, attentions should also be paid to the removed waste liquid, as well as to the requirement of the facility for removing these gases, because the removed waste liquid constitutes a fluorine-based industrial waste material, which poses a serious environmental problem. The environmental problem imparts a serious negative image to the enterprises manufacturing articles such as a solar battery effective for solving the environmental problem. It follows that it is difficult for these enterprises to take these means easily.

The third embodiment is directed a washing method and a washing apparatus for performing the washing such that force for deforming the tray surface is not applied to the tray and for washing a semiconductor film-forming apparatus efficiently at a low cost without requiring a special facility.

To be more specific, in the third embodiment of the present invention, the inner members of the film-forming apparatus and that portion of the tray to which a semiconductor material is attached are formed of detachable parts. Also, a plurality of the detachable parts are supported by a tool, and the tool and the supported detachable parts are simultaneously dipped in an alkaline etchant. After completion of the etching, these tool and the supported parts are washed with an aqueous detergent, followed by drying the washed tool and detachable parts. An alkaline detergent containing caustic soda and/or a surfactant is used as the alkaline etchant. Also, city water or pure water is used as the aqueous washing water.

The apparatus for working the method described above, which is intended to overcome the above-noted problems, comprises a transfer system for transferring a tool supporting a plurality of detachable inner parts of the film-forming chamber and those portions of the tray to which a semiconductor material is attached, an alkaline etchant dipping means in which the tool and the parts supported thereon can be dipped simultaneously, an aqueous washing means in which the tool and the parts supported thereon are put simultaneously after the etching step, and a drying means.

The function of the third embodiment will now be described.

If a thin film is attached to parts inside the apparatus such as a shower plate and an attachment preventing plate or to a tray to such as extent as to be removed, the tray from which the substrate has been removed is transferred onto a carriage arranged in the vicinity of the semiconductor film-forming apparatus. In a large semiconductor film-forming apparatus such as a mass production apparatus, the transfer is performed by using a transfer means such as a crane or a robot attached to the film-forming apparatus.

A large number of shower plates, attachment preventing plates, trays and carriers are used in a large semiconductor film-forming apparatus. When some of these trays are transferred onto the carriage, the carriage is moved to a position close to the washing apparatus. A mechanism for holding a plurality of washing materials is arranged in an upper portion of the carriage. The holding mechanism holding the washing materials is detached from the carriage so as to be transferred by the transfer mechanism of the washing apparatus to and dipped in an alkaline etchant vessel.

After completion of the etching, the washing materials are transferred into a rinsing vessel so as to be rinsed with, for example, water. A plurality of rinsing vessels are used so as to carry out the rinsing operation successively such that the washing materials are put first in a rinsing vessel housing city water of a low purity and, then, in a rinsing vessel for applying a high pressure city water to the washing materials. Further, the washing materials are put in rinsing vessels housing an ion-exchange water and pure water, respectively. After completion of the rinsing, the washed members are dried with a warm wind. Further, after completion of the drying, the holding mechanism and the washed members held on the holding mechanism are transferred again onto the carriage and assembled again in the vicinity of the semiconductor film-forming apparatus.

It is possible to maintain a high operating rate of the semiconductor film-forming apparatus, if a spare part is prepared and positioned on the carriage in respect of the part to which a silicon-based film is attached, though use of the spare part depends on the etching reaction rate. In this case, the washing can be performed with a relatively ordinary etchant without using a costly gas so as to lower the washing cost. It should also be noted that the washing materials are transferred onto the carriage by a lifting system. Also, the holding means of the carriage holding the inner parts of the apparatus such as the attachment preventing plate or the tray is transferred through the washing vessels, rinsing vessels and drying chamber. It follows that a deforming force is not applied to the washed members. In addition, the washing efficiency can be improved.

The third embodiment of the present invention will now be described more specifically with reference to FIGS. 8A to 9C. The following description is directed to an apparatus so as to facilitate a specific image depiction. However, the technical scope of the third embodiment is not limited by the following description. Needless to say, the technical idea of the third embodiment is applicable to a similar apparatus or the like.

Tray

Figure 8A:
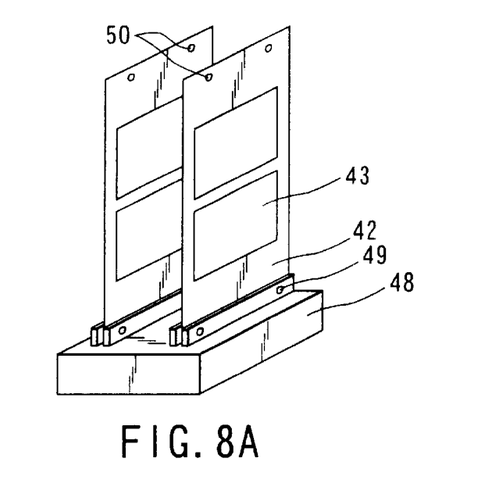
FIGS. 8A and 8B, which collectively show a plasma CVD apparatus, are for description of a third embodiment of the present invention.

The tray 42 used in the third embodiment of the present invention is exemplified in FIG. 8A. In this apparatus, the tray 42 for film formation is mounted on a carrier 48. The tray 42 can be detached from the carrier 48 by driving four screws 49. Also, two hanging holes 50 for transferring onto the carriage are formed in an upper portion of each of the two trays 42. Lifting tools are fitted into these hanging holes 50, and the trays 42 are transferred by a crane or a robot to the hanging portion of the carriage so as to be transferred onto the carriage. A plurality of trays 42 are disposed on the carriage.

Figure 8B:
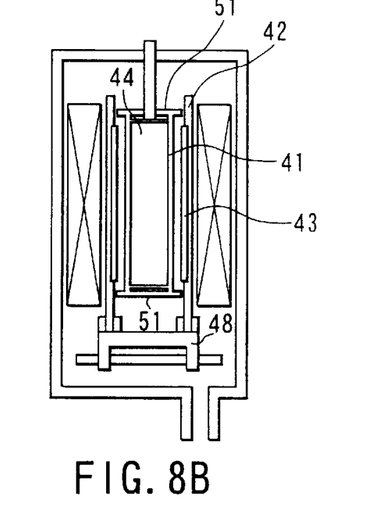

The embodiment shown in the drawings is featured in that the attachment preventing plates 51 are mounted in upper and lower portions of the shower plate 41 as shown in FIG. 8B so as to prevent a film from being formed in the portion of the carrier 48. It should be noted in this connection that a mechanism for smoothly carrying out the transfer is present in the carrier 48 and, thus, a problem is generated that liquid enters fine portions during, for example, the etching treatment. Also, the attachment preventing plates 51 are intended to diminish the number of parts in the washing portion as much as possible. Incidentally, each of the carrier 48 and the tray 42 is formed of a material resistant to alkali. To be more specific, it is desirable to use stainless steel, carbon, a metal coated with a ceramic material, etc. for forming the carrier 48 and the tray 42.

It is possible to design appropriately the tray 42 and the carriage 52 relating to the present invention, as far as the film-forming region is limited to the tray 42 and the tray 42 is resistant to alkali. For example, a carriage in which trays are housed in a rack can be used when it comes to a CVD apparatus of the type that the substrate is held horizontal during the film formation. Also, when it comes to a CVD apparatus of the type that the substrates are held vertical such that the trays are hung on a cart running on an upper rail arranged within the CVD apparatus, it suffices to prepare a carriage in which a large number of hanger-like tools are arranged for supporting only the trays.

Shower Plate, Attachment Preventing Plate

The shower plate 41 and the attachment preventing plate 51 are also constructed to be detachable like the tray 42. Also, a large part such as the shower plate 41 is hung on a tool like the tray 42 so as to be transferred onto the carriage 52. On the other hand, the other small parts are housed in a basket made of a metal net.

In the apparatus used in recent years, the parts other than the shower plate 41 and the attachment preventing plate 51 are constructed such that a silicon-based film is not attached to these parts in order to permit the maintenance of the apparatus to be performed easily. The apparatus of the present invention is also designed in this fashion.

Carriage

It is desirable for the carriage 52 to be constructed such that the portion for holding the tray 42 is detachable from the carriage body. A hook 54 for hanging all the washing is mounted in the holding portion. Since the particular portion is put in a vessel of the washing apparatus, used is a stainless steel or a metal frame covered with an alkali-resistant plating or coated with resin. On the other hand, the carriage is designed to maintain a sufficient mechanical strength.

Washing Vessel

Figures 9A, 9B, 9C:
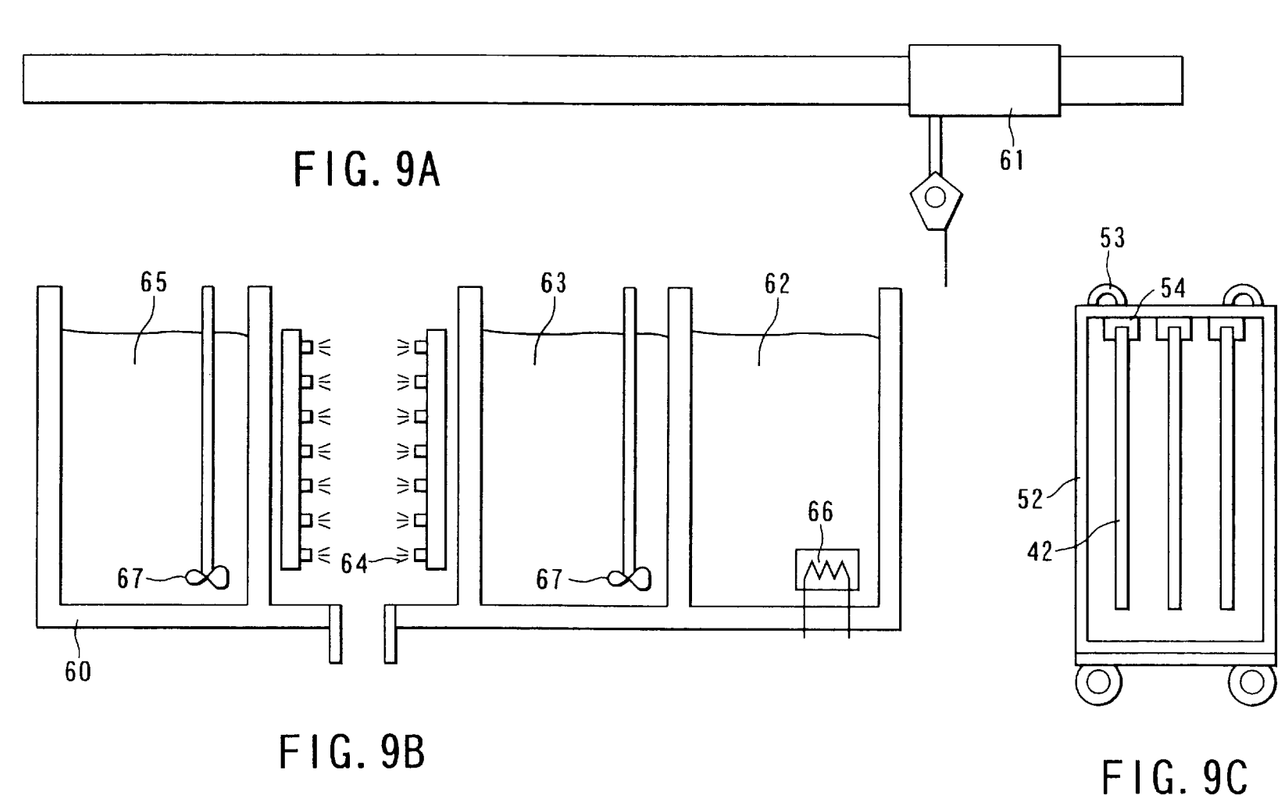
FIGS. 9A to 9C collectively show a washing facility used in the third embodiment of the present invention.

FIGS. 9A to 9C exemplify washing vessels used in this embodiment. In this example, an alkali washing vessel 62, a first rinsing vessel 63, a water wash vessel 64 utilizing a high pressure water shower and a second vessel 65 are successively arranged. Also, a crane 61 or a robot facility for moving the upper holding portion of the carriage is arranged in an upper portion of the vessel.

A strongly alkaline detergent or an aqueous solution of caustic soda or caustic potash is used in the alkali washing vessel. In the case of using an aqueous solution of caustic soda (NaOH), the caustic soda concentration of the solution is controlled at 3 to 10% by weight. It is known to the art that the etching rate is increased substantially in proportion to the caustic soda concentration where the caustic soda concentration falls within a range of between 0 and 3% by weight. Where the caustic soda concentration exceeds 5% by weight, the etching rate is slowly increased at substantially a constant rate to reach the maximum etching rate at about 35% by weight of the caustic soda concentration. Further, the etching rate tends to be decreased where the caustic soda concentration exceeds 40% by weight. Since the etching rate is not prominently increased where the caustic soda concentration exceeds 3% by weight, it suffices in practice to set the caustic soda concentration at 3%. However, since the etchant is utilized repeatedly, the caustic soda concentration is adjusted not to be higher than 5% by weight or not to be higher than 10% by weight. It should be noted that, where the caustic soda concentration exceeds 10% by weight, the solid component within the etchant is frozen in winter, making it difficult to supervise the etchant. Further, the time for the rinsing process can be shortened in the case of setting the caustic soda concentration at a low level.

If a thin film silicon or an amorphous silicon is put in an alkali washing vessel, a vigorous reaction is brought above in the initial period so as to generate a large amount of mists of hydrogen and caustic soda. Therefore, the washing vessel is exhausted by mounting, for example, a draft blower in an upper portion of the vessel. Heat is also generated vigorously such that the about 25° C. of the liquid temperature before the etching is increased to exceed 40° C. However, the reaction is carried out thereafter such that the liquid temperature is slowly lowered. In order to promote the reaction, a heater 66 is arranged within the vessel. Since the reaction is carried out in the activation process that can be represented by the Arrhenius plot relative to the liquid temperature, the reaction rate can be markedly increased by elevating the temperature to about 80° C. The reaction rate in this stage reaches 3 $\mu$m/min. If the temperature is further elevated, it is possible for a problem to be generated that the etchant is boiled in the vicinity of the heater 66.

In addition to the liquid temperature elevation, a measure to allow the etchant to permeate the inner parts of the apparatus such as the tray, the electrode and the attachment preventing plate is also effective for increasing the reaction rate. The permeation can be achieved by adding a strongly alkaline surfactant to the etchant. If the silicon-based film attached to the parts inside the apparatus is slightly cracked, the etchant permeates the interface between the silicon-based film and the parts through the crack by the capillary phenomenon. As a result, the etching is started in the interface before the etching proceeds on the surface. Therefore, the silicon-based film is finally peeled off the parts. It follows that the processing can be finished in a time markedly shorter than the time calculated by A/B where A represents the thickness of the silicon-based film, and B represents the etching rate.

It is said that the forming rate of a polycrystalline silicon or amorphous silicon semiconductor layer is 0.1 Å to 100 Å/sec (0.0006 to 0.6 $\mu$m/min), and that the range of the forming rate satisfying the requirement in the characteristics of the formed layer and in economy is 1 to 40 Å/sec (0.006 to 0.24 $\mu$m/min). Since the etching rate in this embodiment is 3 $\mu$m/min, the third embodiment of the present invention achieves a sufficiently economical etching rate.

After completion of the etching treatment, the rinsing operation is performed for removing the etchant. In this embodiment, after the etchant remaining on the washing parts is roughly removed, the washing parts are transferred into the first rinsing vessel 63 before the surfaces of the washing parts are dried. In this embodiment, the alkali components are efficiently removed with a water stream. Since the aqueous rinsing solution is used in this step for neutralizing the alkali, the rinsing solution is repeatedly used for the rinsing operation.

In the next step, the washing parts are transferred into the water washing vessel 64 utilizing a high pressure water shower so as to remove completely the alkali. Also, a silicon flake slightly remaining in the washing parts is removed by the high pressure shower. The high pressure water shower is effective particularly where a solid component causing the plugging of the shower plate remains on the washing parts.

In the second rinsing vessel 65 arranged in the final stage, the stains on the surface are removed by the water stream and an aqueous rinsing solution that is continuously replaced. At the same time, the impurities of the rinsing solution used in the preceding rinsing stage are replaced by the new rinsing solution so as to finish the washing.

It is desirable to use water as the rinsing liquid in each of the first and second rinsing vessels. Preferably, a high purity water should be used.

Then, the washing parts are combined with the lower portion of the carriage and transferred into a large hot air dryer together with the tool for the drying purpose, followed by cooling the dried parts and subsequently storing the treated parts in a spare reservoir or mounting again the treated parts on the main body.

For effectively utilizing the present invention, it is highly effective to use a spare part. To be more specific, when the maintenance of the apparatus is started, the spare part is mounted immediately after the parts are detached from the main body of the carriage having the spare mounted thereon. It is possible to minimize the loss time of the apparatus in the case of employing the system that the washing of the detached parts is started in the washing step. Also, the washing step can be finished in about 8 hours, i.e., the sum of 330 minutes (5.5 hours) of the etching time and 2 hours for the rinsing and drying operations, even if the silicon-based film is attached in a large thickness, e.g., about 1 mm. It is possible to automate the tray washing by designing appropriately the apparatus. It is also possible to automate the washing of the other parts except the detachment of the parts from the main body of the semiconductor manufacturing apparatus and the assembly of the parts.

It has been clarified by the research conducted by the present inventors that the technical idea of the present invention is effective for use in a plasma CVD apparatus for forming an amorphous silicon thin film or polycrystalline silicon thin film. On the other hand, it has also been clarified that the etching rate is low in the case of a carbon-containing film such as an a-SiC:H film. In such a case, the present inventors employ the system that an amorphous silicon thin film or a polycrystalline silicon thin film, which can be etched easily, are formed first in a thickness of at least 0.5 $\mu$m, followed by forming a film such as an a-SiC:H film by mounting the washed parts to the apparatus, though the reaction rate in the case of using caustic potash is higher than that in the case of using caustic soda.

In this case, the underlying silicon film can be etched easily in an early time, if a surfactant is added to the liquid, making it possible to solve the problem that the etching rate of the parts in a particular chamber is unduly low in the case of simultaneous performing the washing in an apparatus for forming different kinds of films like an in-line type apparatus.

Also, a chemical reaction is employed in the present invention. If the apparatus is effectively formed as a system, a physical stress is not generated and, thus, the parts such as the tray are not deformed at all.

Caustic soda, caustic potash and a surfactant (alkaline detergent) used in the present invention are very commonplace and cheap in cost, compared with the etching gas. Also, polyvinyl chloride or stainless steel, which are excellent in corrosion resistance, is used for forming the apparatus. These materials are commonplace and are not costly like a vacuum apparatus.

Disposal of Waste Liquid

It is necessary to remove harmful substances from the etching solution and from the liquid in the first rinsing vessel before the waste liquid is discarded. The reaction products between silicon and a solution of caustic soda contain basically compounds of silicon, oxygen, hydrogen and sodium (mainly sodium silicate). If these reaction products are neutralized with hydrochloric acid, formed are an aqueous solution of table salt and silicon compound ($SiO_2$), which are quite harmless. Therefore, no problem is generated even if the waste liquid is discharged to the outside. In this respect, the present invention is advantageous in terms of the environmental contamination problem.

As described above, according to the third embodiment of the present invention, the washing of an apparatus for forming a silicon-based semiconductor film such as a plasma CVD apparatus is performed by using a carriage in which only the parts of the apparatus having a silicon-based film attached thereto are separated and mounted and by also using an etching type washing-drying facilities in which are housed the particular parts and the carriage holding these parts. Also, caustic soda, caustic potash and a surfactant (alkaline detergent) are used as the etchant. The particular construction of the third embodiment makes it possible to remove the various silicon-based films attached to the tray without imparting deformation to the tray. Also, the washing operation can be simplified. What should also be noted is that the waste material of the etching consists essentially of an aqueous solution of table salt and silicon and, thus, does not give a detrimental effect to the environment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for washing a solar cell manufacturing apparatus provided with a film-forming chamber and a tray having a glass substrate mounted thereto, the method comprising:

dipping an inner part of the film-forming chamber and the tray in an alkaline etchant containing caustic soda for performing etching, thus removing semiconductor material attached to the inner part of the film-forming chamber and semiconductor material attached to the tray;

washing the etched members with an aqueous rinsing liquid; and drying the washed members.

2. The method according to claim 1, wherein the inner part of the film-forming chamber and the tray, which are to be subjected to washing, are those which are repeatedly used in the film-forming process in the film-forming chamber without to be washed.

3. The method according to claim 1, wherein the inner part of the film-forming chamber and the tray, which are to be subjected to washing, are those which are used in the film-forming process in which a silicon film is formed and thereafter a SiC film is formed on the silicon film in the film-forming chamber.

4. The method according to claim 1, wherein the alkaline etchant contains 5 to 35% by weight of caustic soda.

5. The method according to claim 1, further comprising:

neutralizing an alkaline etchant waste liquid to form sodium chloride and $SiO_2$; and discarding the sodium chloride and $SiO_2$.

* * * * *